(12) United States Patent
Welz et al.

(10) Patent No.: US 7,586,378 B2
(45) Date of Patent: Sep. 8, 2009

(54) METHOD AND SYSTEM FOR USING A FREQUENCY LOCKED LOOP LOGEN IN OSCILLATOR SYSTEMS

(76) Inventors: Jared Welz, 4349 Birchwood Ave., Seal Beach, CA (US) 90740; Brima Babatunde Ibrahim, 21 Stone Pine, Aliso Viejo, CA (US) 92656; Stephen Wu, 18420 Gifford St., Fountain Valley, CA (US) 92708

( * ) Notice: Subject to any disclaimer, the term of this patent is extended or adjusted under 35 U.S.C. 154(b) by 65 days.

(21) Appl. No.: 11/831,399

(22) Filed: Jul. 31, 2007

(65) Prior Publication Data
US 2008/0231375 A1   Sep. 25, 2008

Related U.S. Application Data

(60) Provisional application No. 60/895,665, filed on Mar. 19, 2007.

(51) Int. Cl.
*H03L 7/08* (2006.01)
(52) U.S. Cl. .............................. 331/14; 331/17; 331/25; 455/260
(58) Field of Classification Search .................. 331/1 A, 331/14, 17, 18, 25, DIG. 2; 327/156–159; 332/127; 360/51; 375/376; 455/260
See application file for complete search history.

(56) References Cited

U.S. PATENT DOCUMENTS 6,363,126 B1 * 3/2002 Furukawa et al. ........... 375/344
6,600,797 B1 * 7/2003 Hasegawa et al. ........... 375/376

* cited by examiner

*Primary Examiner*—David Mis
(74) *Attorney, Agent, or Firm*—McAndrews, Held & Malloy, Ltd.

(57) ABSTRACT

Aspects of a method and system for using a frequency locked loop LOGEN in oscillator systems may include generating an oscillating signal via one or more circuits comprising a feedback loop. The generation may be controlled by enabling or disabling the feedback loop, based on the generated oscillating signal. The one or more circuits may comprise a frequency-locked loop (FLL) that may enable the generation of the oscillating signal. The frequency-locked loop may comprise a voltage-controlled oscillator. The feedback loop may be disabled when an estimated frequency difference between a reference signal and a feedback signal may be less than or equal to a specified threshold. The feedback loop may be enabled when an estimated frequency difference between a reference signal and a feedback signal may be greater than a particular threshold.

26 Claims, 6 Drawing Sheets

METHOD AND SYSTEM FOR USING A FREQUENCY LOCKED LOOP LOGEN IN OSCILLATOR SYSTEMS

CROSS-REFERENCE TO RELATED APPLICATIONS/INCORPORATION BY REFERENCE

This application makes reference to, claims priority to, and claims the benefit of U.S. Provisional Application Ser. No. 60/895,665, filed on Mar. 19, 2007.

The above referenced application is hereby incorporated herein by reference in its entirety.

FIELD OF THE INVENTION

Certain embodiments of the invention relate to signal processing for communication systems. More specifically, certain embodiments of the invention relate to a method and system for using a frequency locked loop LOGEN in oscillator systems.

BACKGROUND OF THE INVENTION

Electronic communication has become prolific over the last decade. While electronic communication was initially limited to the desktop, recent trends have been to make communications, media content and the Internet available anytime, anywhere and, increasingly, on any device. Already now, it is quite common to find mobile devices such as cellular phones or Personal Digital Assistants (PDAs) that incorporate a large range of communication technologies and associated software. For example, fully-featured web-browsers, email clients, MP3 players, instant messenger software, and Voice-over-IP may all be found on some recent devices.

In this same spirit of the 'anytime, anywhere' paradigm, there is a drive towards making content stored on portable devices available on a variety of displays and user interfaces. For example, many portable media devices may be enabled to provide a video output signal to a computer monitor or a television to allow display of, for example, digital photographs. For audio content, one possible output format may be a low-power FM transmission signal. Recent changes, for example, in European regulation by CEPT/ETSI to the category of Short Range Devices (SRD) may now permit the use of very low power FM transmitters to transmit in the FM radio broadcast spectrum at powers of around 50 nW. Such devices may interfere with and may experience interference from regular FM broadcast radio and it may hence be desirable to enhance coexistence between FM broadcast stations and personal FM micro-transmitters.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for using a frequency locked loop LOGEN in oscillator systems, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for using a frequency locked loop LOGEN in oscillator systems. Aspects of the method and system for using a frequency locked loop LOGEN in oscillator systems may comprise generating an oscillating signal via one or more circuits comprising a feedback loop. The generation may be controlled by enabling or disabling the feedback loop, based on the generated oscillating signal. The one or more circuits may comprise a frequency-locked loop (FLL) that may enable the generation of the oscillating signal. The frequency-locked loop may comprise a voltage-controlled oscillator. The feedback loop may be disabled when an estimated frequency difference between a reference signal and a feedback signal may be less than or equal to a specified threshold. The feedback loop may be enabled when an estimated frequency difference between a reference signal and a feedback signal may be greater than a particular threshold. The one or more circuits may comprise a digital-to-analog converter and enabling the feedback loop may be achieved by activating one or more inputs of the digital-to-analog converter. Conversely, disabling the feedback loop may be achieved by deactivating one or more inputs of the digital-to-analog converter. The one or more circuits may comprise a transmitter, wherein the transmitter may comprise an FM radio transmitter. Similarly, the one or more circuits may comprise a receiver, wherein the receiver may comprise an FM radio receiver. A radio-frequency signal may be modulated and/or demodulated using the generated oscillating signal.

Figure 1:
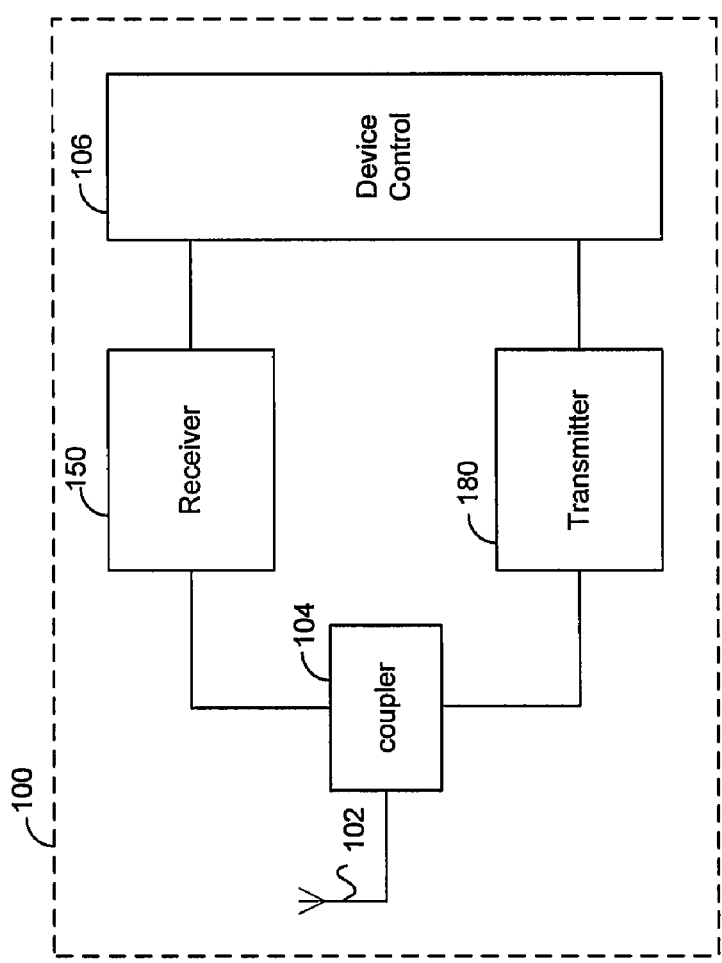
FIG. 1 is a block diagram illustrating an exemplary transceiver system, in accordance with an embodiment of the invention.

FIG. 1 is a block diagram illustrating an exemplary transceiver system, in accordance with an embodiment of the invention. Referring to FIG. 1, there is shown a transceiver system 100 comprising an antenna 102, a coupler 104, a receiver 150, a transmitter 180 and a device control 106.

The transceiver system 100 may comprise suitable logic, circuitry and/or code that may be enabled to transmit and receive, for example, FM signals simultaneously on different frequencies and/or in an alternating fashion on the same frequency. The transmitter 180 may comprise suitable logic, circuitry and/or code to enable generation of a transmit signal that may be communicated to the coupler 104. The receiver 150 may comprise suitable logic, circuitry and/or logic that may enable reception and/or processing of FM signals, fed to it from the coupler 104. The antenna 102 may be a shared antenna for a transmit signal path and a receive signal path. The transmit signal path from the transmitter 180 and the receive signal path to the receiver 150 may be coupled to the antenna 102 at the coupler 104 that may comprise suitable logic, circuitry and/or code to join the receive signal path and the transmit signal path, in order to communicatively couple a common signal path to antenna 102. A device control block 106 may comprise suitable logic, circuitry and/or code to enable controlling the transmitter 180 and the receiver 150. The control block 106 may control, for example, a gain and/or a demodulation frequency in the receiver 150 and, for example, a transmit power and frequency of the transmitter 180. The functionality of the device control block 106 may not be limited to the functionality described above.

In various other embodiments of the invention, the transceiver system 100 may not comprise a receiver 150; and/or the receiver 150 and the transmitter 180 may use separate antennas. In various other embodiments of the invention, the transceiver system 100 may be a stand-alone system or may form part of a device, for example, a personal audio player or a cellular mobile phone. The invention may not be limited to the examples given above. In various embodiments of the invention, the transmitter 180 and the receiver 150 and/or the transceiver system 100 may comprise one or more local oscillator generators comprising suitable logic, circuitry and/or code that may be enabled to generate an oscillating signal for use in at least modulation and demodulation in the transmitter 180 and the receiver 150, respectively. In some instances, one or more local oscillator generators may be common to both transmitter 180 and receiver 150.

Figure 2:
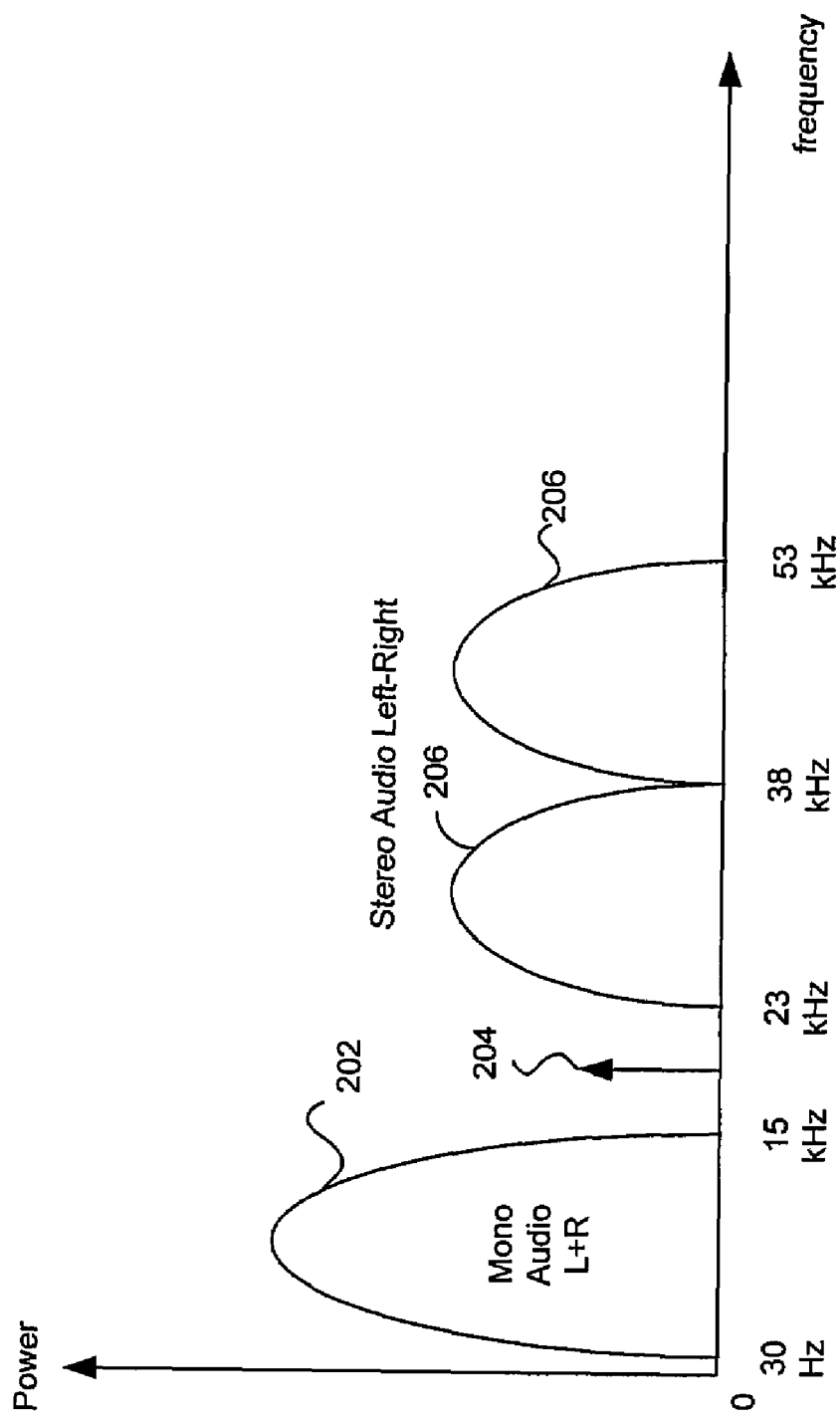
FIG. 2 is a frequency spectrum diagram of an exemplary FM baseband broadcast channel, in connection with an embodiment of the invention.

FIG. 2 is a frequency spectrum diagram of an exemplary FM baseband broadcast channel, in connection with an embodiment of the invention. Referring to FIG. 2, there is shown a mono channel 202, a pilot carrier 204, and a stereo channel 206. There is also shown a frequency axis and a power axis.

The diagram in FIG. 2 may illustrate a power distribution over frequencies of an exemplary FM broadcast channel at baseband frequencies. An FM broadcast channel may comprise further signal components, for example Radio Broadcast Data Service (RBDS) that may not be illustrated in FIG. 2. A mono channel 202, comprising the sum of a left and a right audio channel may be located in the spectrum from approximately 30 Hz to 15 kHz. In order to ensure compatibility between mono receivers and stereo receivers, a difference scheme may be used for stereo transmission, where the mono channel M 202 may be the sum of the left audio channel L and the right audio channel R signals, that is, M=(L+R)/2. A difference signal S=(L−R)/2 may be generated from the left audio channel L and the right audio channel R, also referred to as a stereo channel. The difference signal S may be frequency-translated to a center frequency of 38 kHz by double-sideband suppressed carrier modulation, to provide the stereo channel 206. By suitably combining the M and the S signal, the left and right audio channels may be recovered from the sum and difference signals, as given by the following relationship:

$L=M+S$ $R=M-S$

Hence, in the case of a mono receiver, it may suffice to process the mono channel 202. In the case of a stereo receiver, it may be desirable to process the mono channel 202 and the stereo channel 206. The pilot carrier 204 may be used, for example, for tuning purposes, synchronization and other maintenance and supporting functionality at the receiver.

Figure 3:
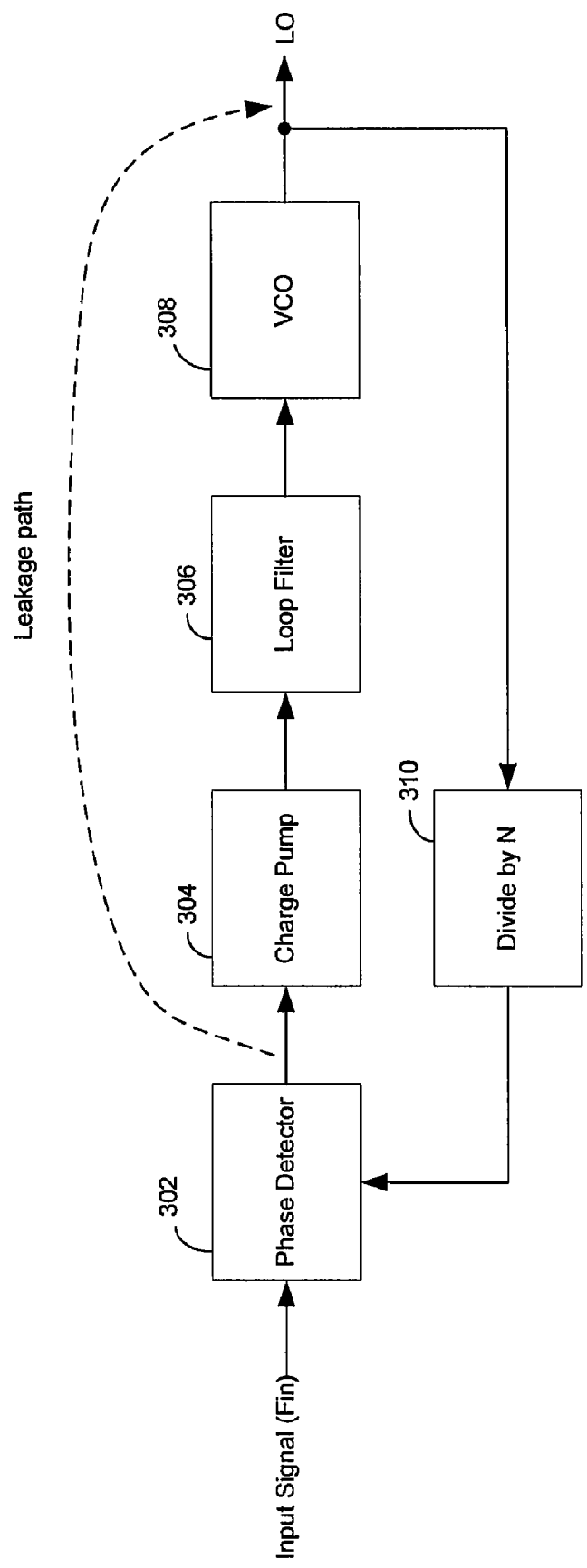
FIG. 3 is a block diagram illustrating an exemplary local oscillator generator based on a phase-locked loop (PLL) design, in connection with an embodiment of the invention.

FIG. 3 is a block diagram illustrating an exemplary local oscillator generator based on a phase-locked loop (PLL) design, in connection with an embodiment of the invention. Referring to FIG. 3, there is shown a phase detector 302, a charge pump 304, a loop filter 306, a voltage-controlled oscillator (VCO) 308 and a frequency divider 310. There is also shown a local oscillator signal, LO, and an input signal, Fin.

The VCO 308 may comprise suitable logic, circuitry and/or code that may be enabled to generate a local oscillator signal, for example, approximately sinusoidal. The frequency at its output terminal may be proportional to a voltage applied at its input. As the voltage at the input of the VCO 308 may change, the frequency of the local oscillator signal LO may change. In order to obtain and/or maintain a desired frequency for the local oscillator signal LO, the local oscillator signal may be fed back to the phase detector 302, via frequency divider 310. The frequency divider 310 may comprise suitable logic, circuitry and/or code that may be enabled to divide the frequency of its input signal by a factor N, where N may be an integer. This may permit the VCO 308 to operate at locked frequencies that may correspond to integer multiples of the frequency of the input signal Fin. The input signal Fin may be, for example, a reference clock signal. In particular, in instances when the PLL may be required to generate a large number of frequencies, it may be desirable to have a highly accurate input signal Fin at a comparatively low frequency that may enable local oscillator signals at N times the frequency of Fin. By suitably programming the frequency divider 310 and/or changing the frequency of the input signal Fin, the local oscillator LO frequency may be adjusted.

The phase detector 302 may comprise suitable logic, circuitry and/or code that may be enabled to compare the phase and/or frequency of its input signals. The phase detector 302 may be fed the input signal Fin, and the local oscillator signal LO, frequency divided by a factor N, may be communicatively coupled to the phase detector 302 from the output of the frequency divider 310. The phase and frequency of the input signal Fin and the feedback signal may be compared in phase detector 302. For example, at every rising edge of the input signal Fin, the phase detector may detect a lead time or a lag time between the input signal Fin and the frequency-divided local oscillator. If there is a lag, the phase detector 302 may generate a corrective signal that may trigger a pulse with, for example, an increased voltage at the output of the charge pump 304. If there is a lead, the phase detector 302 may generate a corrective signal that may trigger a pulse with, for example, a decreased voltage at the output of the charge pump 304. Hence, the charge pump 304 may comprise suitable logic, circuitry and/or code to output a voltage pulse, for example, for every rising edge of the input signal Fin that may be coupled to the phase detector 302. The output of the charge pump 304 may be coupled to the loop filter 306. The loop filter 306 may comprise suitable logic, circuitry and/or code that may be enabled to perform filtering of the signal applied at the loop filter 306 input. The loop filter 306 may be desirable to define certain characteristics of a PLL circuit, for example capture range and/or pull-in time.

In some instances, the frequency of the input signal Fin that may be a reference signal for the phase detector 302 may be quite low and may fall within the range of the modulated signal. For example, an input signal Fin may be a 32.768 kHz reference signal from a crystal oscillator. In many devices that may comprise a real time clock, 32.768 kHz oscillators may be used since this frequency may correspond to $2^{15}$ cycles per second, which may permit simple usage for clock applications that may use binary counters. In many applications, the reference signal that may be utilized as an input signal Fin to the phase detector 302 may hence be determined by available high-precision oscillators, for example, crystal oscillators.

Since the phase detector 302 may clock the charge pump 304 on each rising edge of the input signal, the charge pump 304 may fire at the frequency of the input signal Fin. Although the pulses from the charge pump may be communicatively coupled to the loop filter 306 where they may be attenuated, some signal component at the frequency of the input signal may still reach the input of the VCO 308 and hence may effectively be modulated onto the local oscillator output. Feed-through of the reference frequency may be caused, for example, by imperfect cancellation of push/pull currents in the charge pump 304 and/or coupling between power supply and ground. In some instances, the charge pump 304 may fire at the frequency of the input signal Fin, even when the PLL may be locked. This leakage of the charge pump 304 firing frequency may be called a frequency spur in the local oscillator signal LO. In instances where the input signal Fin is at, for example, 32.768 kHz, as described above, there may be a frequency spur at about 32.768 kHz above the local oscillator frequency. However, as may be seen in FIG. 2, 32.768 kHz may be located in one of the sidebands of the stereo signal S 206. In other words, when the FM baseband signal depicted in FIG. 2 may be modulated onto a local oscillator, the baseband signal depicted in FIG. 2 may be shifted by the frequency of the local oscillator, and the frequency spur at 32.768 kHz may be superimposed onto a sideband of the stereo channel. Since the information in these sidebands of the stereo channel 206 may be used for stereo signal reception, the frequency spur at, for example 32.768 kHz, may result in an audible interference signal at approximately 5-9 kHz, which may be a high-pitched but well-audible interference tone. Therefore, it may be desirable to minimize the frequency spur in the audible portion of the frequency spectrum.

Figure 4A:
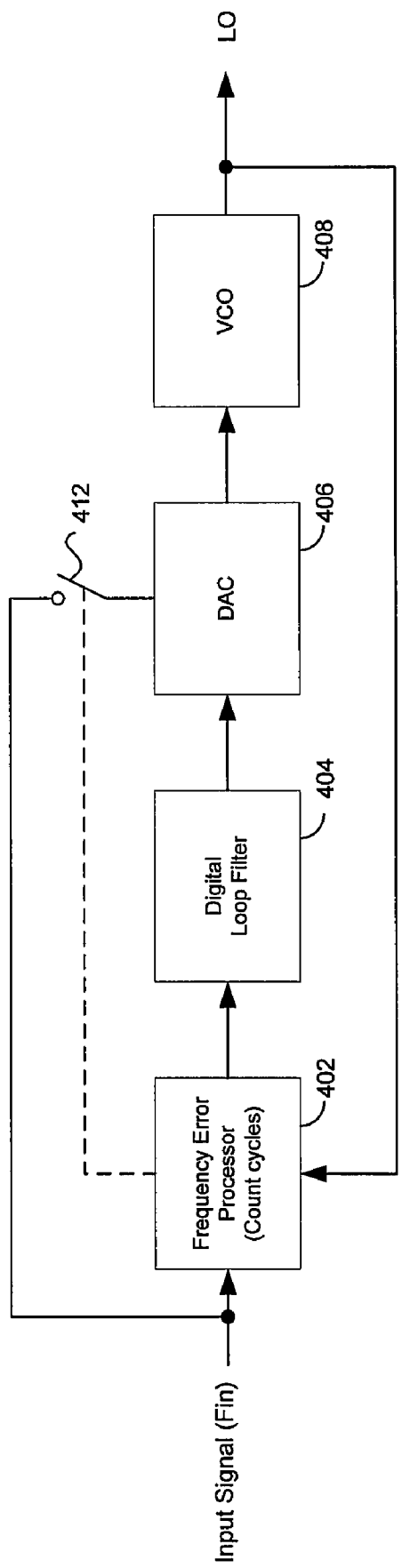
FIG. 4A is a block diagram illustrating a frequency-locked loop (FLL), in accordance with an embodiment of the invention.

FIG. 4A is a block diagram illustrating an exemplary frequency-locked loop (FLL), in accordance with an embodiment of the invention. Referring to FIG. 4A, there is shown a frequency error processor 402, a digital loop filter 404, a digital-to-analog converter (DAC) 406, a voltage-controlled oscillator (VCO) 408, and a switch 412. There is also shown an input signal Fin and a local oscillator signal LO.

In accordance with an embodiment of the invention, FIG. 4A may illustrate a local oscillator signal generator based on a frequency-locked loop that may significantly reduce spur frequencies. The VCO 408 may be substantially similar to the VCO 308 illustrated in FIG. 3. In particular, the local oscillator signal LO generated at the output of the VCO 408 may be a function of the VCO 408 input voltage. The local oscillator LO signal may be fed back to the frequency error processor 402. The frequency error processor 402 may comprise suitable logic, circuitry and/or code to count cycles of the local oscillator signal LO. For example, the frequency error processor 402 may count the number of rising edge zero-crossings of the local oscillator signal that may be communicatively coupled from the output of the VCO 408 to its input. The second input to the frequency error processor 402 may be a reference clock signal that may be supplied by the input signal Fin. Similarly to FIG. 3, the input signal Fin may be a signal at frequency, for example, 32.768 kHz.

The frequency error processor 402 may comprise, for example, two counters. A first counter, a reference counter, may be clocked by the input signal Fin. Since the input signal Fin may be a high-precision clock signal, for example from a crystal oscillator, the reference counter may be used to measure a precise time interval. A second counter within the frequency error processor 402 may count the cycles of the local oscillator, for example by counting rising edge zero crossings, as described above. By counting the number of zero crossings over a given time interval, the frequency error processor 402 may determine the frequency of the local oscillator signal. For example, the frequency error processor 402 may output a signal that may be proportional to a difference between the two counters.

In another embodiment of the invention, the output value of the frequency error processor 402 may be proportional to an absolute counter value over a time window due to the number of local oscillator cycles counted. The output of the frequency error processor 402 may be communicatively coupled to a digital loop filter 404. The digital loop filter 404 may comprise suitable logic, circuitry and/or code that may be enabled to filter, for example, using a discrete 1-pole low-pass filter. In various embodiments of the invention, the digital loop filter 404 may be used to smooth the sequence of values that are input from the frequency error processor 402. The output of the digital loop filter 404 may be fed to the DAC 406. The DAC 406 may comprise suitable logic, circuitry and/or code that may be enabled to convert the discrete value at its input from the digital loop filter 404 to an analog output voltage. The analog output voltage may be used to control the VCO 408. The DAC 406 may convert a discrete input value every time it may be clocked. For example, every time a rising edge may be detected at the DAC 406 clock input, the input value may be converted to an analog voltage value and the value may be maintained at the output until another rising edge may be detected. A DAC that may maintain a constant output between clock inputs may be referred to as a non-return-to-zero (NRZ) DAC. The DAC 412 may be clocked, for example, by the input signal Fin via the switch 412. In instances when the switch 412 may be closed, the DAC 406 may work continuously and update its output at the frequency of the input signal Fin, for example, 32.768 kHz. In instances when the switch 412 may be open, the DAC may not update its output value and maintain a constant output voltage, which may cause the VCO 408 to maintain an approximately constant local oscillator frequency. Opening the switch 412 may be a way to effectively interrupt the local oscillator feedback loop.

The switch 412 may be controlled, for example, by the frequency error processor 402. A reason to open the switch 412 is that it may maintain the output voltage of the DAC 406 at a constant value over a certain time period. For example, the switch 412 may be initially open and the VCO 408 may generate a local oscillator signal at the target frequency that may be defined by the frequency of the input signal Fin. Since the output of the DAC 406 may not change while the switch 412 may be open and hence the DAC 406 output voltage may remain approximately constant, the input voltage to the VCO 408 may stay approximately constant. The VCO 408 may output an approximately constant frequency local oscillator signal. However, the frequency of the local oscillator VCO 408 may eventually start to drift slowly, even though the input voltage may not change. Due to the feedback of the local oscillator signal LO from the VCO 408 to the frequency error processor 402, the drift may be measured in the frequency error processor 402. When the frequency error, or drift, between the target frequency Fin and the output frequency of the local oscillator signal LO eventually exceeds a threshold, for example $T_{CLOSE}$, the frequency error processor 402 may close the switch 412. By closing the switch 412, the feedback loop may be closed and a correction voltage will be applied to the VCO 408. It may be desirable to establish a threshold $T_{CLOSE}$, or a dead band around the target frequency to be maintained by the local oscillator signal because the local oscillator frequency may be maintained more stable. When frequency lock is achieved and the local oscillator may run at the desired target frequency, the DAC 406 may toggle and/or oscillate around a mean value, due to its discrete nature. This may be seen as a quantization error. This toggling may introduce unnecessary small variations in frequencies at the VCO 408 and may introduce spur frequencies. Hence, it may be desirable to open the feedback loop by opening switch 412 until a certain threshold value $T_{CLOSE}$ may have been exceeded by the frequency error between Fin and the feedback signal. This functionality may be considered to introduce a certain hysteresis for the frequency control circuit.

Once the switch 412 is closed, the feedback circuit may correct the input voltage to the VCO 408 until the local oscillator LO frequency may be similar to the reference frequency. In one embodiment of the invention, the switch 412 may be opened again, for example, after the difference between the local oscillator frequency and the target frequency may have been less than a certain Threshold value, $T_{OPEN}$, for a certain time interval. In another embodiment of the invention, the switch 412 may be opened as soon as the error between the target frequency and the local oscillator frequency may have crossed zero, that is, changed sign from a positive error to a negative error or vice versa.

By opening the feedback loop via switch 412, the risk of interfering frequency spurs in the LO signal may be reduced. Also, the drift of the VCO 408 may be irregular, leading to irregular closing and opening of the switch 412, and may thereby avoid significant frequency spurs in the output spectrum of the local oscillator signal. In some embodiments of the invention, an FLL as described above may be achieved without the use of a charge pump. In these instances, the absence of periodic firing by the charge pump may reduce leakage of undesirable frequency spurs in the output spectrum of the local oscillator signal.

In another embodiment of the invention, analog loop filters may be used in the FLL. For example, in some instances an analog loop filter may be desirable between the DAC 406 and the VCO 408.

Figure 4B:
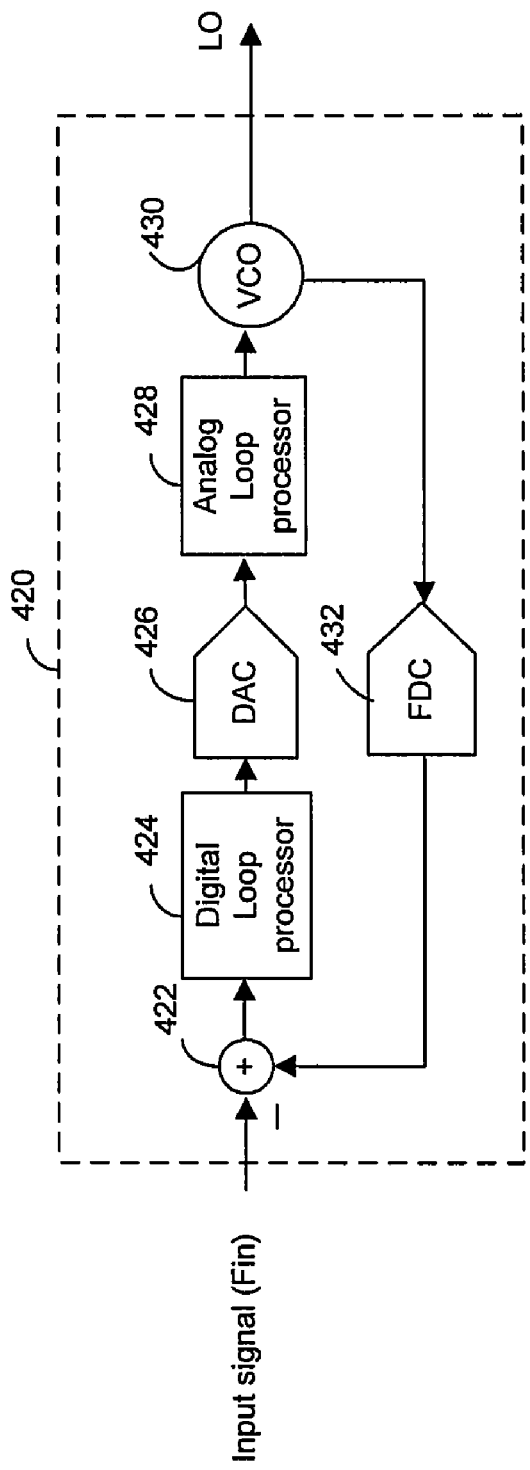
FIG. 4B is a block diagram illustrating an exemplary frequency-locked loop (FLL), in accordance with an embodiment of the invention.

FIG. 4B is a block diagram illustrating an exemplary frequency-locked loop (FLL), in accordance with an embodiment of the invention. Referring to FIG. 4B, there is shown an FLL 420, comprising an adder 422, a digital loop processor 424, a Digital-to-analog converter (DAC) 426, an analog loop processor 428, a voltage-controlled oscillator (VCO) 430 and a frequency-to-digital (FDC) converter 432. There is also shown an input signal Fin and a local oscillator signal LO.

In accordance with an embodiment of the invention, FIG. 4B may illustrate a local oscillator signal generator based on a frequency-locked loop 420 that may significantly reduce spur frequencies. The VCO 430 may be substantially similar to the VCO 308 illustrated in FIG. 3. In particular, the local oscillator signal LO generated at the output of the VCO 430 may be a function of the VCO 430 input voltage. The local oscillator LO signal may be communicatively coupled to the FDC 432. The FDC 432 may comprise suitable logic, circuitry and/or code that may be enabled to generate a digital output code that may be proportional to the frequency of its input signal. For example, the FDC 432 may count the number of rising edge zero-crossings of the local oscillator signal that may be communicatively coupled from the output of the VCO 430 to its input. In various embodiments of the invention, the determination of the frequency in the FDC 432 may be achieved by a variety of protocols. At the adder 422, the digital code generated by the FDC 432 may be subtracted from the input signal (Fin). For this embodiment of the invention, the input signal Fin may be a digital control word, similar to the output signal generated by the FDC 432. The output of the adder 422 may be a difference signal, proportional to the difference between the digital word representing Fin and the digital output word of the FDC 432. This difference signal at the output of the adder 422 may be proportional to the difference between the desired frequency as expressed by the input signal Fin and the LO frequency, as expressed by the FDC 432 output.

The FDC 432 may comprise, for example, one counter. The counter may count the number of VCO 430 rising edges within a certain reference clock period. Since the reference period may be known, the VCO period and hence the frequency of the LO may be estimated using the counter value.

In accordance with the invention, the output value of the FDC 432 may be proportional to an absolute counter value over a time window due to the number of local oscillator cycles counted. The output of the adder 422 may be communicatively coupled to a digital loop processor 424. The digital loop processor 424 may comprise suitable logic, circuitry and/or code that may be enabled to filter, for example, using a discrete 1-pole low-pass filter. In various embodiments of the invention, the digital loop filter 424 may be used to smooth the sequence of values that are input from the adder 422. In various other embodiments of the invention, the digital loop processor 424 may perform additional and/or different signal processing. The output of the digital loop processor 424 may be fed to the DAC 426. The DAC 426 may comprise suitable logic, circuitry and/or code that may be enabled to convert the discrete value at its input from the digital loop processor 424 to an analog output voltage. The analog output voltage may be used to control the VCO 430 via the analog loop processor 428. The analog loop processor 428 may comprise suitable logic, circuitry and/or code that may be enabled to perform operations similar to the digital loop processor 424. The analog loop processor 428 may also be used for noise filtering, for example to reduce quantization noise from the DAC 426. The DAC 426 may convert a discrete input value every time it may be clocked. For example, every time a rising edge may be detected at the DAC 426 clock input (not illustrated in FIG. 4B), the input value may be converted to an analog voltage value and the value may be maintained at the output until another rising edge may be detected. A DAC 426 that may maintain a constant output signal level between clock inputs may be referred to as a non-return-to-zero (NRZ) DAC. Similarly to FIG. 4A, the DAC 426 may be enabled or disabled. In one embodiment of the invention, the DAC 426 may remain clocked in disabled mode and instead the input to the DAC 426 may be disabled, for example through the use of digital hardware.

Similar to FIG. 4A, a deadzone and/or hysteresis may be enabled in various embodiments of the invention, for example, by appropriately enabling and/or disabling the input to the DAC 426.

Figure 5:
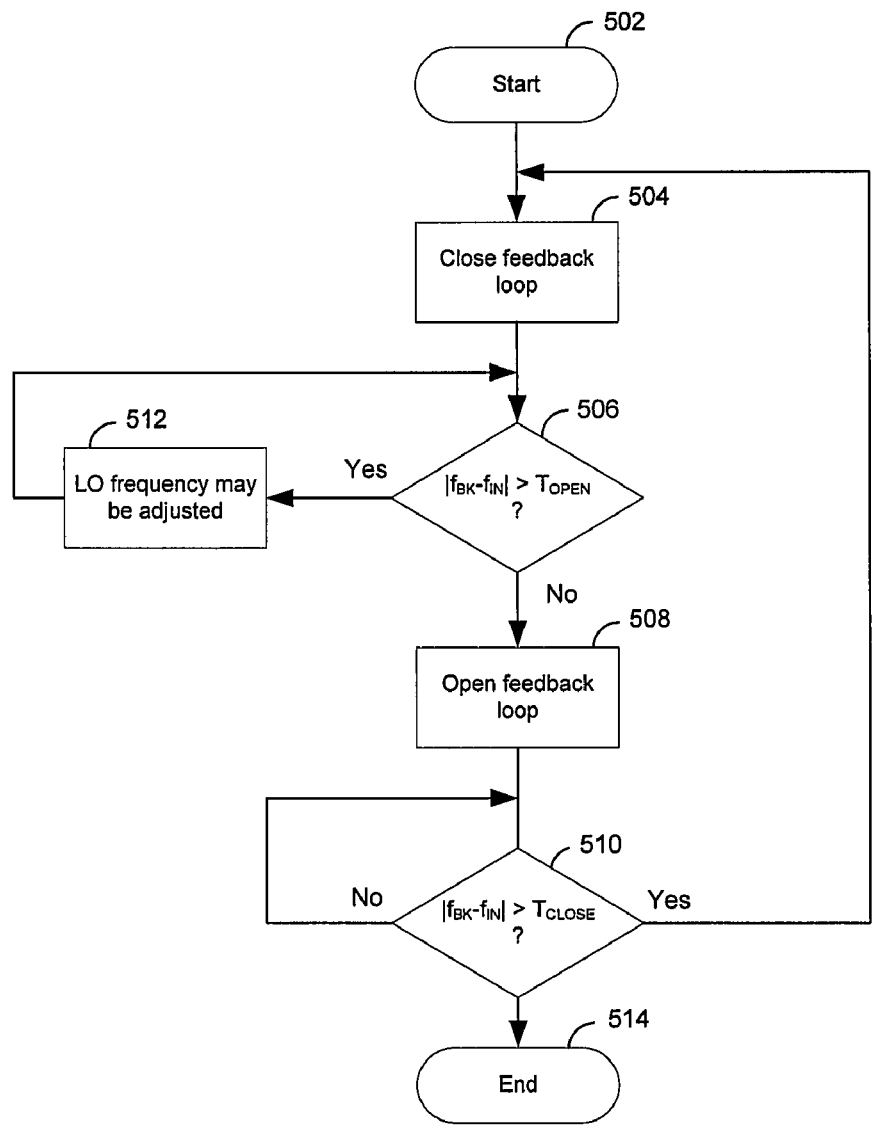
FIG. 5 is a flow chart illustrating an exemplary local oscillator control algorithm, in accordance with an embodiment of the invention.

FIG. 5 is a flow chart illustrating an exemplary local oscillator control algorithm, in accordance with an embodiment of the invention. The algorithm to control the local oscillator frequency may be started by closing the feedback loop in step 504. In one embodiment of the invention, closing the feedback loop in step 504 may be similar to closing the switch 412 in FIG. 4A to clock the DAC 406. By closing the feedback loop in step 504, the local oscillator frequency may be actively controlled and/or regulated, as illustrated by step 512. Conversely, if the feedback loop is open, the local oscillator frequency may not be actively controlled and/or regulated. Since the feedback loop may be closed in step 504, the difference between a feedback frequency $f_{BK}$ and a reference frequency $f_{IN}$ may be measured in step 506, $|f_{BK}-f_{IN}|$. The difference may, for example, be compared to a threshold $T_{OPEN}$. If the difference between $f_{BK}$ and $f_{IN}$ exceeds the threshold $T_{OPEN}$, the difference may indicate that the feedback frequency $f_{BK}$ may require further adjustment. This may be achieved by adjusting the local oscillator frequency in step 512, for example through a VCO.

This process of comparing the difference between $f_{BK}$ and $f_{IN}$ to the threshold $T_{OPEN}$ in step 506 and adjusting the local oscillator frequency in step 512, may be continued until the difference $|f_{BK}-f_{IN}|$ may be less or equal to the threshold $T_{OPEN}$. When the difference $|f_{BK}-f_{IN}|$ may be less or equal to the threshold $T_{OPEN}$ in step 506, the feedback loop may be considered locked, or on target, and the feedback loop may be opened in step 508. In step 510, the difference $|f_{BK}-f_{IN}|$ may be compared to a threshold $T_{CLOSE}$. If the difference $|f_{BK}-f_{IN}|$ does not exceed the threshold $T_{CLOSE}$ in step 510, the feedback loop may remain open. If the difference $|f_{BK}-f_{IN}|$ may exceed the threshold $T_{CLOSE}$ in step 510, the feedback frequency $f_{BK}$ may have drifted off too far from the reference frequency $f_{IN}$ and the feedback loop may be closed in step 504. In one embodiment of the invention, a hysteresis, also referred to as dead band or dead zone, between opening and closing the feedback loop, for example by opening and closing the switch 412, may be defined by $|T_{OPEN}-T_{CLOSE}|$.

In accordance with an embodiment of the invention, a method and system for using a frequency locked loop LOGEN in oscillator systems may comprise generating an oscillating signal, for example in a frequency-modulation (FM) system, via one or more circuits comprising a feedback loop, as illustrated in FIG. 4A and FIG. 4B. The generation may be controlled by enabling or disabling the feedback loop, based on the generated oscillating signal, as illustrated in FIG. 5. The one or more circuits may comprise a frequency-locked loop (FLL) that may enable the generation of the oscillating signal, for example LO. The frequency-locked loop may comprise a voltage-controlled oscillator 408. The feedback loop may be disabled when an estimated frequency difference between a reference signal and a feedback signal may be less than or equal to a specified threshold, as explained for FIG. 5 and threshold Topen. Similarly, the feedback loop may be enabled when an estimated frequency difference between a reference signal and a feedback signal may be greater than a particular threshold, for example Tclose in FIG. 5. The one or more circuits may comprise a digital-to-analog converter, for example DAC 406, and enabling the feedback loop may be achieved by activating one or more inputs of the digital-to-analog converter DAC 406. Conversely, disabling the feedback loop may be achieved by deactivating one or more inputs of the digital-to-analog converter, for example DAC 406. The one or more circuits may comprise a transmitter 180, wherein the transmitter may comprise an FM radio transmitter. Similarly, the one or more circuits may comprise a receiver 150, wherein the receiver 150 may comprise an FM radio receiver. A radio-frequency signal may be modulated and/or demodulated using the generated oscillating signal, as illustrated for example in FIG. 2.

Another embodiment of the invention may provide a machine-readable storage, having stored thereon, a computer program having at least one code section executable by a machine, thereby causing the machine to perform the steps as described herein for using a frequency locked loop LOGEN in oscillator systems.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
   generating an oscillating signal via one or more circuits comprising a feedback loop; and
   controlling said generation by enabling or disabling said feedback loop utilizing a digital-to-analog converter, based on a comparison of said generated oscillating signal and an input signal, wherein said digital-to-analog converter is triggered by said input signal and an output of said digital-to-analog converter adjusts said oscillating signal when said feedback loop is enabled, and an output of said digital-to-analog converter remains constant when said feedback loop is disabled.

2. The method according to claim 1, wherein said one or more circuits comprise a frequency-locked loop (FLL) that enables said generation of said oscillating signal.

3. The method according to claim 2, wherein said frequency-locked loop comprises a voltage-controlled oscillator.

4. The method according to claim 1, comprising disabling said feedback loop when an estimated frequency difference between a reference signal and a feedback signal is less than or equal to a specified threshold.

5. The method according to claim 1, comprising enabling said feedback loop when an estimated frequency difference between a reference signal and a feedback signal is greater than a particular threshold.

6. The method according to claim 1, wherein said one or more circuits comprise a non-return-to-zero digital-to-analog converter and one or more inputs of said non-return-to-zero digital-to-analog converter are activated for said controlling said generation of said oscillating signal.

7. The method according to claim 1, wherein said one or more inputs of said digital-to-analog converter are deactivated for said constant output of said digital-to-analog converter.

8. The method according to claim 1, wherein said one or more circuits comprise a transmitter.

9. The method according to claim 8, wherein said transmitter comprises an FM radio transmitter.

10. The method according to claim 1, wherein said one or more circuits comprises a receiver.

11. The method according to claim 10, wherein said receiver comprises an FM radio receiver.

12. The method according to claim 1, comprising modulating a radio-frequency signal using said generated oscillating signal.

13. The method according to claim 1, comprising demodulating a radio-frequency signal using said generated oscillating signal.

14. A system for processing signals, the system comprising:
one or more circuits comprising a feedback loop and digital-to-analog converter, said one or more circuits enable:
generation of an oscillating signal; and
control of said generation by enabling or disabling said feedback loop utilizing a digital-to-analog converter, based on a comparison of said generated oscillating signal and an input signal, wherein said digital-to-analog converter is triggered by said input signal and an output of digital-to-analog converter adjusts said oscillating signal when said feedback loop is enabled and an output of said digital-to-analog converter remains constant when said feedback loop is disabled.

15. The system according to claim 14, wherein said one or more circuits comprise a frequency-locked loop (FLL) that enables said generation of said oscillating signal.

16. The system according to claim 15, wherein said frequency-locked loop comprises a voltage-controlled oscillator.

17. The system according to claim 14, wherein said one or more circuits disable said feedback loop when an estimated frequency difference between a reference signal and a feedback signal is less than or equal to a specified threshold.

18. The system according to claim 14, wherein said one or more circuits enable said feedback loop when an estimated frequency difference between a reference signal and a feedback signal is greater than a particular threshold.

19. The system according to claim 14, wherein said one or more circuits comprise a non-return-to-zero digital-to-analog converter and one or more inputs of said non-return-to-zero digital-to-analog converter are activated for said control of said generation of said oscillating signal.

20. The system according to claim 14, wherein said one or more inputs of said digital-to-analog converter are deactivated for said disabling of said constant output of said digital-to-analog converter.

21. The system according to claim 14, wherein said one or more circuits comprise a transmitter.

22. The system according to claim 21, wherein said transmitter comprises an FM radio transmitter.

23. The system according to claim 14, wherein said one or more circuits comprises a receiver.

24. The system according to claim 23, wherein said receiver comprises an FM radio receiver.

25. The system according to claim 14, wherein said one or more circuits modulate a radio-frequency signal using said generated oscillating signal.

26. The system according to claim 14, wherein said one or more circuits demodulate a radio-frequency signal using said generated oscillating signal.

* * * * *